United States Patent
Wu et al.

(10) Patent No.: US 11,680,972 B2
(45) Date of Patent: *Jun. 20, 2023

(54) METHOD OF MONITORING STATIC CHARGE

(71) Applicant: TAIWAN SEMICONDUCTOR MANUFACTURING COMPANY LTD., Hsinchu (TW)

(72) Inventors: Shin-Ta Wu, Hsinchu (TW); Chwen Yu, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/697,926

(22) Filed: Mar. 18, 2022

(65) Prior Publication Data
US 2022/0206053 A1 Jun. 30, 2022

Related U.S. Application Data

(63) Continuation of application No. 16/883,947, filed on May 26, 2020, now Pat. No. 11,280,823.

(60) Provisional application No. 62/926,249, filed on Oct. 25, 2019.

(51) Int. Cl.
*G01R 29/12* (2006.01)
*G01R 31/00* (2006.01)

(52) U.S. Cl.
CPC ........... *G01R 29/12* (2013.01); *G01R 31/001* (2013.01)

(58) Field of Classification Search
CPC .............................. G01R 29/12; G01R 31/001
USPC .......................................................... 324/457
See application file for complete search history.

(56) References Cited

U.S. PATENT DOCUMENTS

| 5,136,247 A | * | 8/1992 | Hansen | G01R 29/12 |
| | | | | 324/458 |
| 2010/0147676 A1 | * | 6/2010 | Goudy, Jr. | B03C 3/49 |
| | | | | 204/229.5 |
| 2014/0216508 A1 | * | 8/2014 | Korbler | B06B 1/0607 |
| | | | | 310/334 |

OTHER PUBLICATIONS

Jing, Ke, et al. "The study about flow velocity measurement with spatial filter principle based on the electrostatic sensor." Proceedings of 2011 International Conference on Electronic & Mechanical Engineering and Information Technology. vol. 6. IEEE, 2011. (Year: 2011).*

(Continued)

*Primary Examiner* — Christopher P McAndrew
(74) *Attorney, Agent, or Firm* — WPAT Law; Anthony King

(57) ABSTRACT

A method of monitoring static charge is provided. The method includes the operations as follows. A metallic plate is connected to a conductive tape wrapped around an outer surface of a non-conductive tube. A plurality of static charges are detected from the metallic plate by an electrostatic field meter, wherein the conductive tape and the metallic plate are entirely disposed within a metallic box. A flow rate of a fluid flowing through the non-conductive tube is adjusted according to the plurality of static charges detected by the electrostatic field meter.

20 Claims, 7 Drawing Sheets

(56) References Cited

OTHER PUBLICATIONS

Noras, Maciej A. "Measurement of flowing charges with an electrostatic voltmeter." Conference Record of the 2004 IEEE Industry Applications Conference, 2004. 39th IAS Annual Meeting. vol. 4. IEEE, 2004. (Year: 2004).*

* cited by examiner

METHOD OF MONITORING STATIC CHARGE

CROSS REFERENCE TO RELATED APPLICATION

The present application is a continuation application of prior-filed U.S. application Ser. No. 16/883,947, filed May 26, 2020, and claims the benefit of prior-filed U.S. provisional application No. 62/926,249, filed Oct. 25, 2019, under 35 U.S.C. 120.

FIELD

The present disclosure relates to a monitoring system and a method of monitoring static charge, and more particularly, to a monitoring system and a method of using the same that may monitor the amount of static electricity or static charges and analyze a relationship between a fluid and a surface of a tube regarding the effect of arcing on flow rate.

BACKGROUND

Static electricity is produced by the build-up of electrons on weak electrical conductors or insulating materials. These materials may be gaseous, liquid or solid and may include flammable liquids, powders, plastic films and granules. The generation of static may be caused by the rapid separation of highly-insulated materials by friction or by transfer from one highly-charged material to another in an electric field by induction.

Electrostatic discharge (ESD) is the sudden flow of electricity between two electrically-charged objects caused by contact, an electrical short or dielectric breakdown, and may be sufficient to cause serious electric shock. In the field of semiconductor manufacturing, static control programs have been carefully applied throughout the backend processes of semiconductor assembly operations due to the known problems of electrostatic discharge damage causing yield and reliability issues. However, the issue of static electricity may become more serious in some advanced semiconductor manufacturing processes.

BRIEF DESCRIPTION OF THE DRAWINGS

Aspects of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
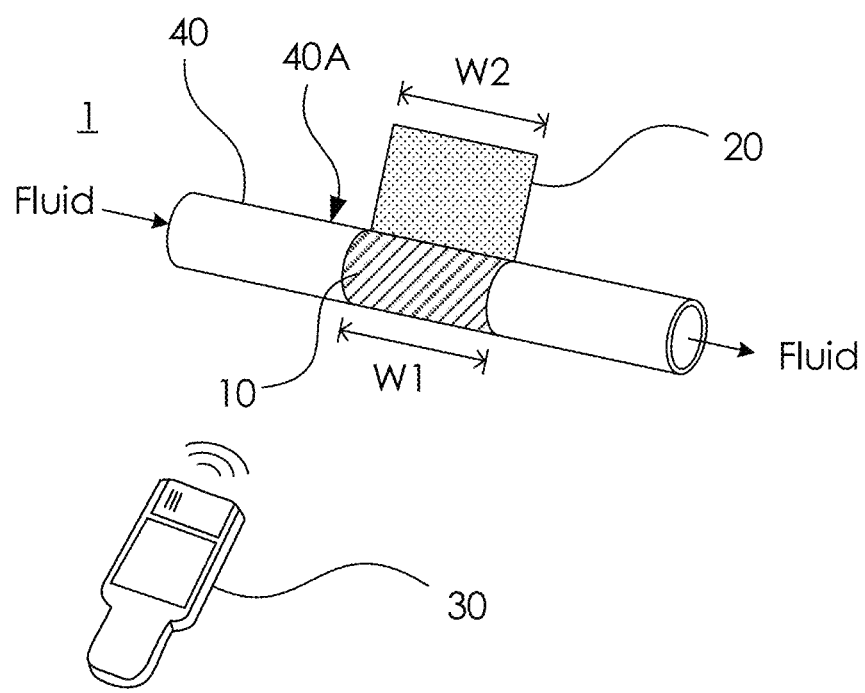
FIG. 1 illustrates a stereo schematic view of a monitoring system according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second," and "third" when used herein do not imply a sequence or order unless clearly indicated by the context.

In the field of semiconductor industry manufacturing, the processes such as photolithography and wet etching have become more sensitive to metals at advanced process nodes. As a result, extracted metals from chemical delivery systems may cause critical wafer defects and impact production yields. For example, some factories utilize non-metal materials in fluid-handling systems to reduce amounts of extracted metals in the process chemicals; however, the increased use of non-metal materials such as fluoropolymer raises concern for electrostatic discharge in components. Particularly, solvents used in the semiconductor industry have low conductivity, which enables them to generate and hold electrical charge.

To be more detailed, there are several high-resistance fluids widely used in semiconductor manufacturing processes, such as butyl acetate and propylene glycol monomethyl ether acetate (PGMEA). Such fluids may induce static charge when passing through a component made of materials having resistances different from those of the fluids (e.g., polytetrafluoroethene (PTFE)) due to friction, and electrical discharge or arcing may occur accordingly.

More precisely, a low-conductivity fluid flowing in a non-conductive tube or component (e.g., a diaphragm pump) may cause charge separation at the interface of the fluid and the tube. As a result, negative charges may be generated or accumulated at such interface, and positive charges and negative charges in the tube may be generated or accumulated respectively in proximity to the inner surface and the outer surface of the tube. Such separation of charge is similar to the phenomenon that occurs when two materials move with respect to each other and the charges are transferred at the interface.

There are several factors that a affect the static charges generated or accumulated in a tube or component made of a non-metal material. For instance, the generation or accumulation of static charges may be increased when the inside diameter, the length, or the resistance per unit length of the tube are increased. Furthermore, the dielectric constant, the volume resistivity, and the surface resistivity of the material of the tube may also increase the generation or accumulation of static charges. On the other hand, the increase of the conductivity of the tube material may decrease the generation or accumulation of static charges.

In some circumstances, for example, when the flow rate of high-resistance fluid such as butyl acetate is too high (e.g., exceeding about 0.7 m/s), the amount of static charges and the total static electricity will increase accordingly. Point discharge may occur as a result and cause arcing, which may produce contamination particles and affect product yield.

In considering the damage to components that the electrical discharge or arcing may cause, and the contamination of the wafer by particles due to such damage, the amount of static charges or the total value of static electricity of the fluids should be monitored for determining whether to take further action, such as real-time reduction of the flow rates of the fluids.

In the field of fluid monitoring, generally, the high-resistance fluids are often volatile solvents, and thus the off-line sampling is complicated and dangerous. In addition, the off-line sampling may not be continuously performed, and the background value of the static electricity may easily be affected by a magnetic field and/or an electrical field from a nearby human body. Moreover, the electric charges at the surface of the tubes made of non-metal materials are not easily moved, so the distribution of potential at the surface of the tubes is not even. As a result, the measurement result provided by an electrostatic field meter may be inaccurate.

Accordingly, some embodiments of the present disclosure provide a monitoring system and a method of monitoring static charge to replace the off-line sampling. In some embodiments, the monitoring system disclosed in the present disclosure may include a conductive tape, wrapped around an outer surface of a plastic tube, and connected to a metallic plate. The static charges may be collected by the conductive tape, induced to the metallic plate and detected by an electrostatic field meter. A real-time alarm may be set to adjust the flow rate immediately and automatically when the electrostatic value exceeds a predetermined value, so that the flow rate can be adjusted in accordance with the change of the amount of static charges. In some embodiments, the real-time alarm includes a valve for adjusting the flow rate, which may be operated automatically or manually.

More precisely, the static charges generated by the friction between the high-resistance fluids and the plastic tubes, pumps or other components are collected by the conductive tape, and the metallic plate connected to the conductive tape may be used as an antenna for the detection. The electric field generated by the static charges on the metallic plate may be detected by the infrared sensor of the electrostatic field meter. In order to avoid the conditions that lead to electrical discharge and arcing, the data collected or generated by the electrostatic field meter may be transmitted to a computer. Such computer may control the flow rate of the high-resistance fluids in the plastic tubes automatically by sending the instruction to slow down or stop the pumps nearby before an accumulation of static charges exceeds a breakdown voltage of the material of the tube or the pump (i.e., the breakdown is not triggered by the accumulation of static charges). The relationship between the static charge and the voltage may be illustrated as $Q=C*V$, wherein Q is the amount of charge, C is the capacitance, which refers the amount of charge may be held or stored by an object, and V is the voltage. Accordingly, the static charge is proportional to the voltage.

FIG. 1 illustrates a stereo schematic view of a monitoring system according to some embodiments of the present disclosure. As shown in the figure, the monitoring system 1 may include a conductive tape 10, a metallic plate 20, an electrostatic field meter 30, and a non-conductive tube 40. The non-conductive tube 40 includes an outer surface 40A. The conductive tape 10 is configured to wrap around the outer surface 40A of the non-conductive tube 40. The metallic plate 20 contacts the conductive tape 10 and extends away from the conductive tape 10. The electrostatic field meter 30 is disposed a predetermined distance away from the metallic plate 20, and thus a static charge of the metallic plate 20 is thereby detectable by the electrostatic field meter 30.

In some embodiments, the non-conductive tube 40 is configured for transporting fluids, wherein each fluid has a resistance greater than a resistance of the non-conductive tube 40. As previously mentioned, the generation or accumulation of static charges may be affected by the properties of the tube; in fact, the properties of the fluid may also affect the generation or accumulation of static charges. For instance, when the flow velocity, the resistance, the dielectric constant, or the relaxation time constant of the fluid is increased, the generation or accumulation of static charges may be increased concurrently. On the other hand, when the resistance of the fluid is decreased, the conductivity of the fluid is increased, and the generation or accumulation of static charges may be decreased also.

Because the properties of both the tube and the fluid may affect the generation or accumulation of static charges, in some embodiments, the comprehensive effect of the amount of static charges is based on the difference between the resistances of the tube and the fluid therein. That is, with greater resistance difference between the two materials, more static charges may be generated or accumulated near the interface thereof, and more serious electrical discharge or arcing may occur.

The static charges on the non-conductive tube 40 may be accumulated by the conductive tape 10. In some embodiments, the conductive tape 10 is wrapped around the non-conductive tube 40, rather than simply attached to the non-conductive tube 40 without surrounding the surface thereof. In such embodiments, it may be ensured that all of the static charges at such section of the non-conductive tube 40 (i.e., a first width W1 of the conductive tape 10) are accumulated completely. The conductive tape 10 may be made by applying an electrically conductive adhesive to a durable, flexible support body. In some embodiments, the conductive tape 10 is made of copper foil or aluminum foil with an electrically-conductive acrylic adhesive.

Generally, the tubes used in factories for transporting fluids are made of plastic materials such as polytetrafluoroethene (PTFE), perfluoroalkoxy alkanes (PFA), polyvinyl chloride (PVC), chlorinated polyvinyl chloride (CPVC), unplasticized polyvinyl chloride (UPVC), and the like. In some circumstances, the tubes may be made of plastic materials with glass fibers such as fiber-reinforced plastic (FRP). As previously mentioned, the static charges generated may not move along the surface of plastic tubes, and exhibit similar behavior on the tubes made of non-metal materials. Accordingly, it is not possible to overcome the issue of electrical discharge or arcing simply by inducing the unwanted static charges to the ground through a ground wire. Therefore, there is a need to monitor such static charges in order to avoid the occurrence of electrical discharge or arcing.

In some embodiments, the static charges collected by the conductive tape 10 may be induced to the metallic plate 20. The metallic plate 20 may be made of metal antenna materials such as copper, copper alloy, aluminum, aluminum alloy, or the like. In some embodiments, the metallic plate 20 extends perpendicular to the outer surface 40A of the non-conductive tube 40. In some embodiments, the first width W1 of the conductive tape 10 is identical to a second width W2 of the metallic plate 20. In some other embodiments, the first width W1 of the conductive tape 10 is not identical to the second width W2 of the metallic plate 20 but is identical to the width of each of the other metallic plates 20 in the semiconductor manufacturing system. That is, the distribution of the static charges in the metallic plate 20 is related to the size and shape thereof, and therefore the geometry of each of the metallic plates 20 in the semiconductor manufacturing system may be aligned to ensure the consistency of the monitoring result of the static charge in the semiconductor manufacturing system.

In some embodiments, the tubes used in factories for transporting fluids are made of metal such as stainless steel. The static charges may be moved in the metal easily; however, if the metal tubes are not grounded, the static charges may accumulate at the outer surface of the tubes, and it is still possible to monitor the generation or accumulation of the static charge by the conductive tape wrapped around the outer surface of the tube and the metallic plate connected thereto.

In the present disclosure, the metallic plate 20 is utilized as an antenna for monitoring. The static charges distributed at the surface 20A of the metallic plate 20 may be monitored by the electrostatic field meter 30, which is disposed a predetermined distance away from the metallic plate 20. The electrostatic field meter 30 may be called a static meter and may be utilized to measure the electrostatic field of an object in volts without contact. In some embodiments, the electrostatic field meter 30 may be used with a parametric amplifier. More precisely, the charges caused by electrostatic induction at the electrostatic field meter 30 may be converted to an alternating current which is proportional to the field strength, and the parametric amplifier may measure the current without loss in relation to the field strength.

In some embodiments, the electrostatic field meter 30 may be fixed at a place near the positions of the conductive tape 10 and the metallic plate 20. The fixing of the electrostatic field meter 30 may ensure the suitable distance between the electrostatic field meter 30 and the metallic plate 20 is maintained, without being affected by shake or sway under repeated manual measurements. As a result, for instance, the manual measurement such as one that uses a Faraday cup may be ruled out. In some embodiments, the electrostatic field meter 30 may be connected to a power supply and hence it may be powered continuously.

Figure 2:
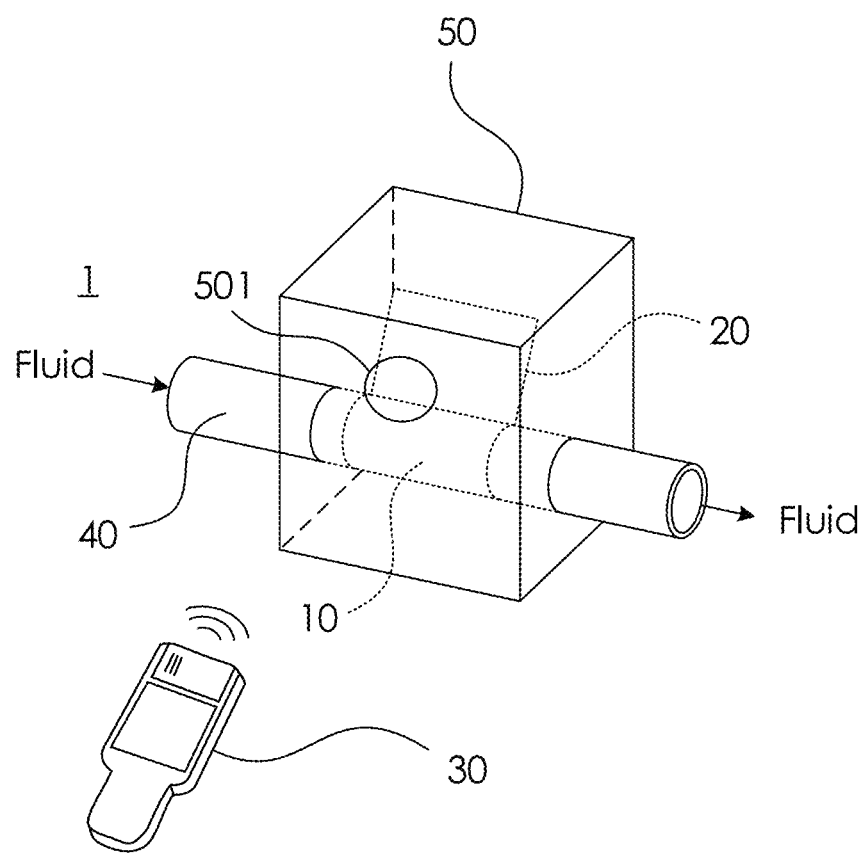
FIG. 2 illustrates a stereo schematic view of a monitoring system according to some embodiments of the present disclosure.

In an external environment, the static electricity monitoring may be greatly affected by the electrical field and the magnetic field. For instance, the electric potential generated from friction by human walking may be as high as about 2000V, and therefore as shown in FIG. 2, in some embodiments, the monitoring system 1 of the present disclosure may include a metallic box 50 covering the conductive tape 10 and the metallic plate 20 for shielding purposes. In some embodiments, the metallic box 50 includes an opening 501 aligned with the electrostatic field meter 30 and the metallic plate 20 for monitoring, that is, the opening 501 faces the electrostatic field meter 30. Moreover, the opening 501 is disposed between the metallic plate 20 and the electrostatic field meter 30, for instance, the opening 501 may at an intermediate point of a linear path between the metallic plate 20 and the electrostatic field meter 30.

The metallic box 50 is utilized to create a Faraday cage and thus an external electrical field and/or a magnetic field (e.g., from the electric charges on a moving human body) may cause the electric charges within the conducting material of the metallic box 50 to be distributed, so that the electric charges may cancel the field's effect in the interior of the metallic box 50. In other words, the components inside the metallic box 50 may be shielded from the interference of the electrical field and the magnetic field outside. In some embodiments, the electrostatic field meter 30 is fixed close to the opening 501 so that most of the linear path between the metallic plate 20 and the electrostatic field meter 30 is shielded by the metallic box 50. In some embodiments, the metallic box itself 50 is grounded.

Figure 3A:
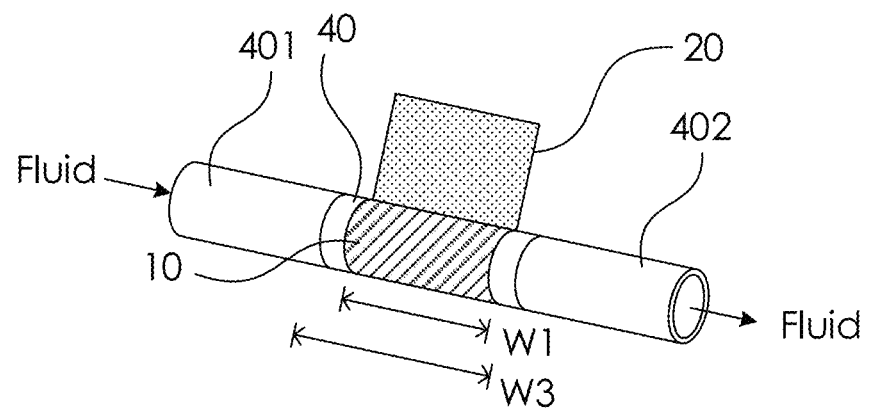
FIG. 3A illustrates a stereo schematic view of a portion of a monitoring system according to some embodiments of the present disclosure.

As shown in FIG. 3A, in some embodiments, each end of the non-conductive tube 40 wrapped by the conductive tape 10 may be connected to and disposed between a first metallic tube 401 and a second metallic tube 402. In such embodiments, the non-conductive tube 40 is made of non-metal materials such as plastic. In other words, the non-conductive tube 40 made of plastic may be added to a semiconductor manufacturing system that uses mainly metallic tubes. In such embodiments, the non-conductive tube 40 made of plastic may be utilized to monitor the static charge generated or accumulated within a specific section in the semiconductor manufacturing system, even though the first metallic tube 401 and the second metallic tube 402 are grounded. In such embodiments, the first width W1 of the conductive tape 10 may be less than a third width W3 of the non-conductive tube 40, so the conductive tape 10 may not be in contact with the first metallic tube 401 and the second metallic tube 402. Otherwise, the electric potential of the metallic plate 20 will be measured as the ground potential instead of the electrostatic potential.

Figure 3B:
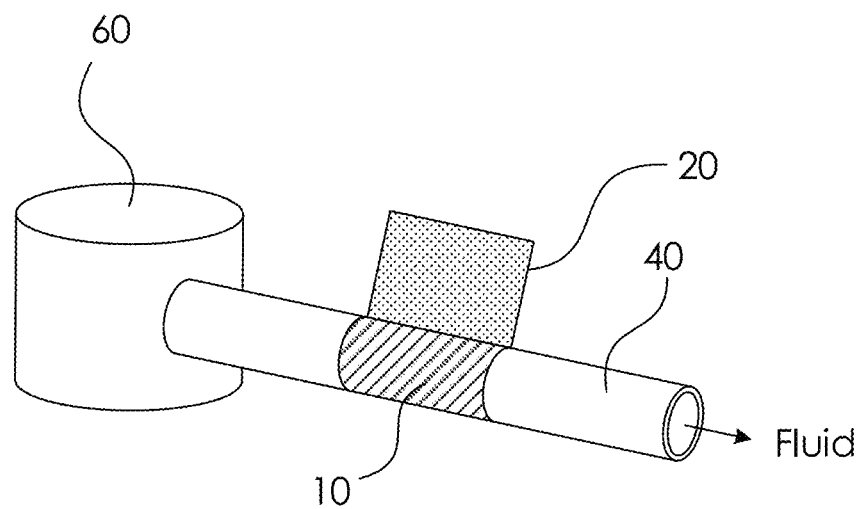
FIG. 3B illustrates a stereo schematic view of a portion of a monitoring system according to some embodiments of the present disclosure.

As shown in FIG. 3B, in some embodiments, the non-conductive tube 40 wrapped by the conductive tape 10 may be connected to a diaphragm pump 60. The diaphragm pump 60, widely used in the semiconductor manufacturing system, is a positive displacement pump which may utilize two flexible diaphragms that reciprocate back and forth, creating a temporary chamber that both draws in and expels fluid through the pump. The diaphragms may work as a separation wall between the air and the liquid. The material of the diaphragm pump 60 includes plastic, and static charge may be generated or accumulated at the diaphragm pump 60 due to the flow of the fluid. Therefore, the static charges generated or accumulated at the diaphragm pump 60 may be monitored by the non-conductive tube 40 wrapped by the conductive tape 10 beside the diaphragm pump 60.

Figure 4:
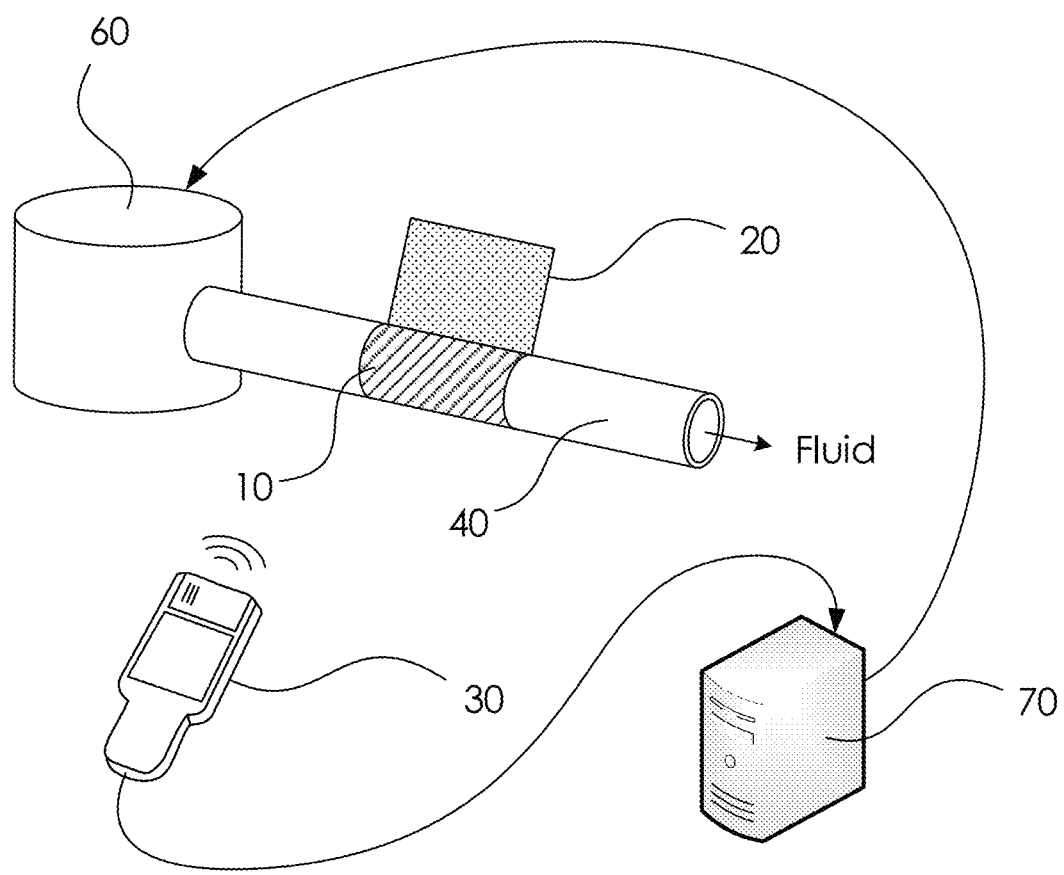
FIG. 4 illustrates a stereo schematic view of a monitoring system according to some embodiments of the present disclosure.

As shown in FIG. 4, in some embodiments, the semiconductor manufacturing system may include a computer 70 coupled to the electrostatic field meter 30. In such embodiments, the computer 70 may be used to adjust a flow rate of a fluid flowing through the non-conductive tube 40 according to a data generated by the electrostatic field meter 30. That is, the present disclosure may monitor the amount of static charges and analyze the relationship between the flow rate of the fluid (e.g., chemical liquid with high resistance) and the arcing caused by the fluid. Accordingly, in some embodiments, a real-time alarm may be set to adjust the flow rate of the fluid automatically when an electrostatic value exceeds a warning value, so that the flow rate may be adjusted intelligently in accordance with the amount of static charges generated or accumulated at the non-conductive tube 40. Furthermore, the metallic box 50 previously shown in FIG. 2 may thus be utilized to avoid false alarms caused by external interference.

Figure 5:
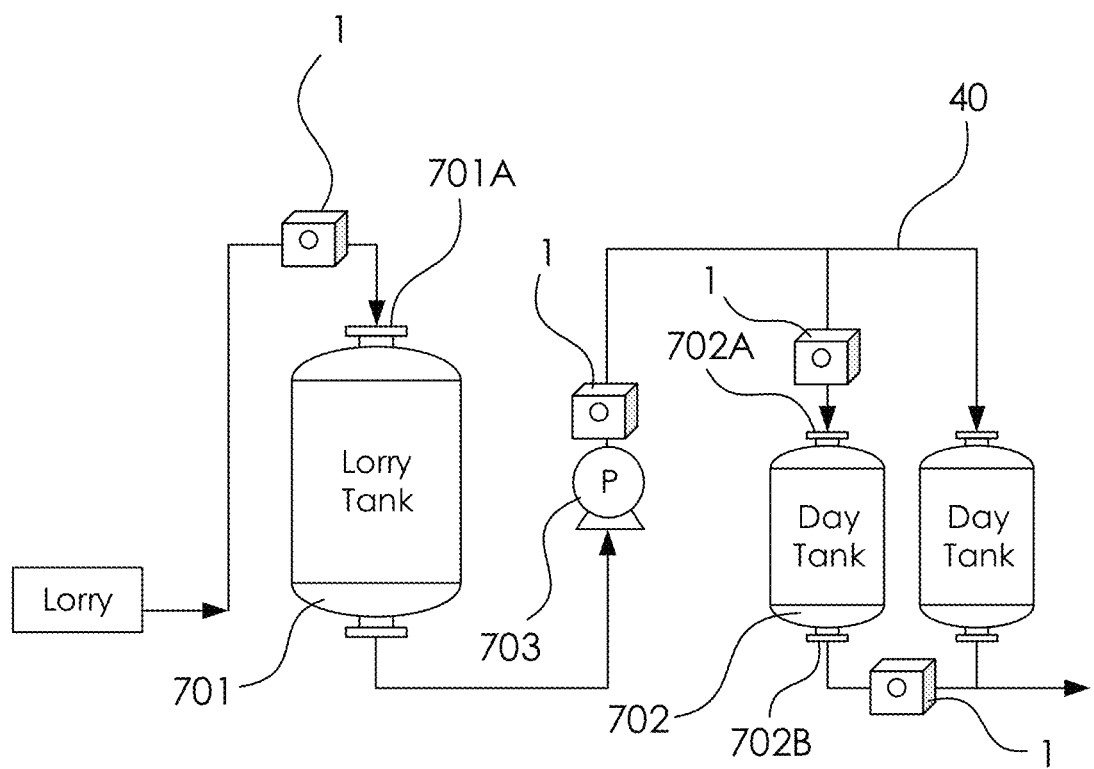
FIG. 5 illustrates a pipeline diagram of a semiconductor manufacturing system according to some embodiments of the present disclosure.

The monitoring system of the present disclosure may be utilized in a semiconductor manufacturing system for maintaining the quality of the fluid for semiconductor processing. As shown in FIG. 5, in some embodiments, the semiconductor manufacturing system may include a plurality of tanks 701 and 702 and a plurality of non-conductive tubes 40 configured to connect the plurality of tanks 701 and 702. In some embodiments, the plurality of tanks may include at least a first tank 701. The first tank 701 is a lorry tank and is arranged at the front end of the semiconductor manufacturing system and is the tank for storing the liquids from a lorry. That is, the chemical liquids transported by the lorries may be first pumped into the first tank 701 for later use. In some embodiments, the monitoring system 1 includes the conductive tape 10, the metallic plate 20, and the electrostatic field meter 30 as previously shown in FIG. 1, disposed near the first tank 701. In some embodiments, the conductive tape 10 may be wrapped around the surface of the non-conductive tube 40 connected to an inlet 701A of the first tank 701. The monitoring system 1 near the first tank 701 may be used to control the flow rate of the fluid flowing from the lorry into the first tank 701. If static charges are generated or accumulate quickly near the inlet 701A, arcing may thus occur, and the impurities or contaminants generated thereby may contaminate the fluid in the first tank 701. Accordingly, in some embodiments, the flow rate of the fluid injected into the first tank 701 may be automatically adjusted in real time by the computer 70 (previously shown in FIG. 4) based on the monitoring data generated by the electrostatic field meter 30.

In some embodiments, the plurality of tanks may include at least a second tank 702. Generally, the second tank 702 is a day tank and is utilized to store fuel, and in some embodiments, the second tank 702 may be utilized to store the liquids for semiconductor processing. In order to force the liquids out of the second tank 702, in some embodiments, some gases such as nitrogen ($N_2$) may be pumped into the second tank 702. Because the friction between the tube and the nitrogen gas may generate static charges, the objects monitored by the monitoring system may further include the metallic plate on a gas tube, and the flow rate of the gas may be adjusted in real time based on the static charges detected by the electrostatic field meter. In some embodiments, the conductive tape 10 may be wrapped around the surface of the non-conductive tube 40 connected to an inlet 702A or an outlet 702B of the second tank 702.

In some embodiments, the semiconductor manufacturing system may include at least a pump 703 connected to the non-conductive tube 40, and the flow rate of the liquid pumped by the pump 703 may be adjusted in real time according to the static charges detected by the electrostatic field meter. Moreover, the pump 703 may include some components which are made of plastics, and by adjusting the flow rate of the liquid (e.g., butyl acetate), the voltage induced by the static charges generated or accumulated at the pump 703 may be kept below a breakdown voltage of the material of the pump 703.

Figure 6:
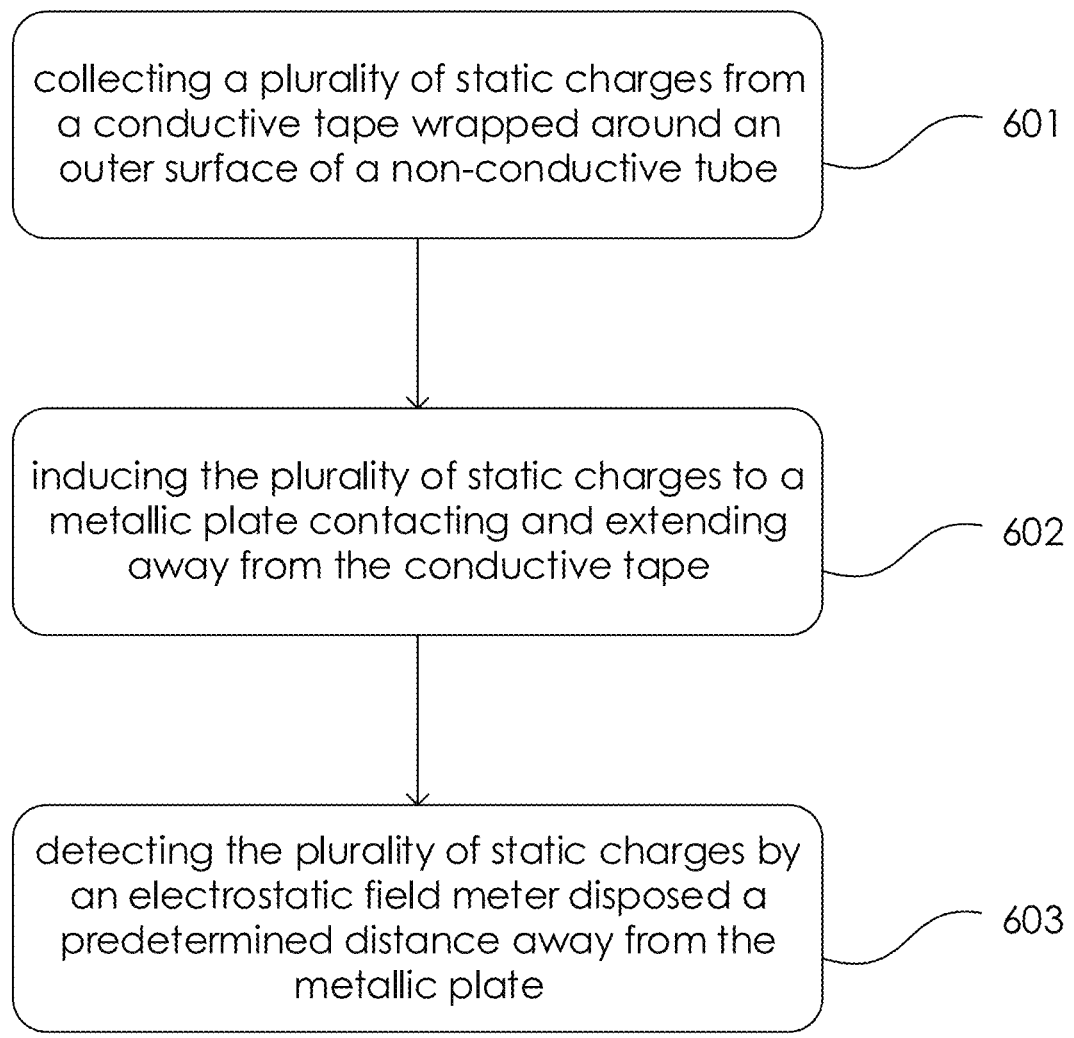
FIG. 6 illustrates a flow chart of monitoring static charge according to some embodiments of the present disclosure.

FIG. 6 illustrates a flow chart of monitoring static charge according to some embodiments of the present disclosure. In some embodiments, the measurement includes an operation 601: collecting a plurality of static charges from a conductive tape wrapped around an outer surface of a non-conductive tube; an operation 602: inducing the plurality of static charges to a metallic plate contacting and extending away from the conductive tape; and an operation 603: detecting the plurality of static charges by an electrostatic field meter disposed a predetermined distance away from the metallic plate.

In performing the operations 601, 602 and 603, the monitoring system disclosed in FIG. 1 may be utilized, and the repeated descriptions of the features and functions of the monitoring system are omitted here for brevity. In addition, in order to adjust the flow rate of the liquid in real time, in some embodiments, the method of monitoring static charge may further include operations that include transmitting a data generated by the electrostatic field meter to a computer and adjusting a flow rate of a fluid flowing through the tube by the computer.

In performing the operation of adjusting the flow rate in real time, in some embodiments, the flow rate may be decreased when the total voltage induced by the plurality of static charges detected by the electrostatic field meter is nearly equal to or greater than a breakdown voltage of the material of the non-conductive tube or a pump connected to the non-conductive tube.

Figure 7:
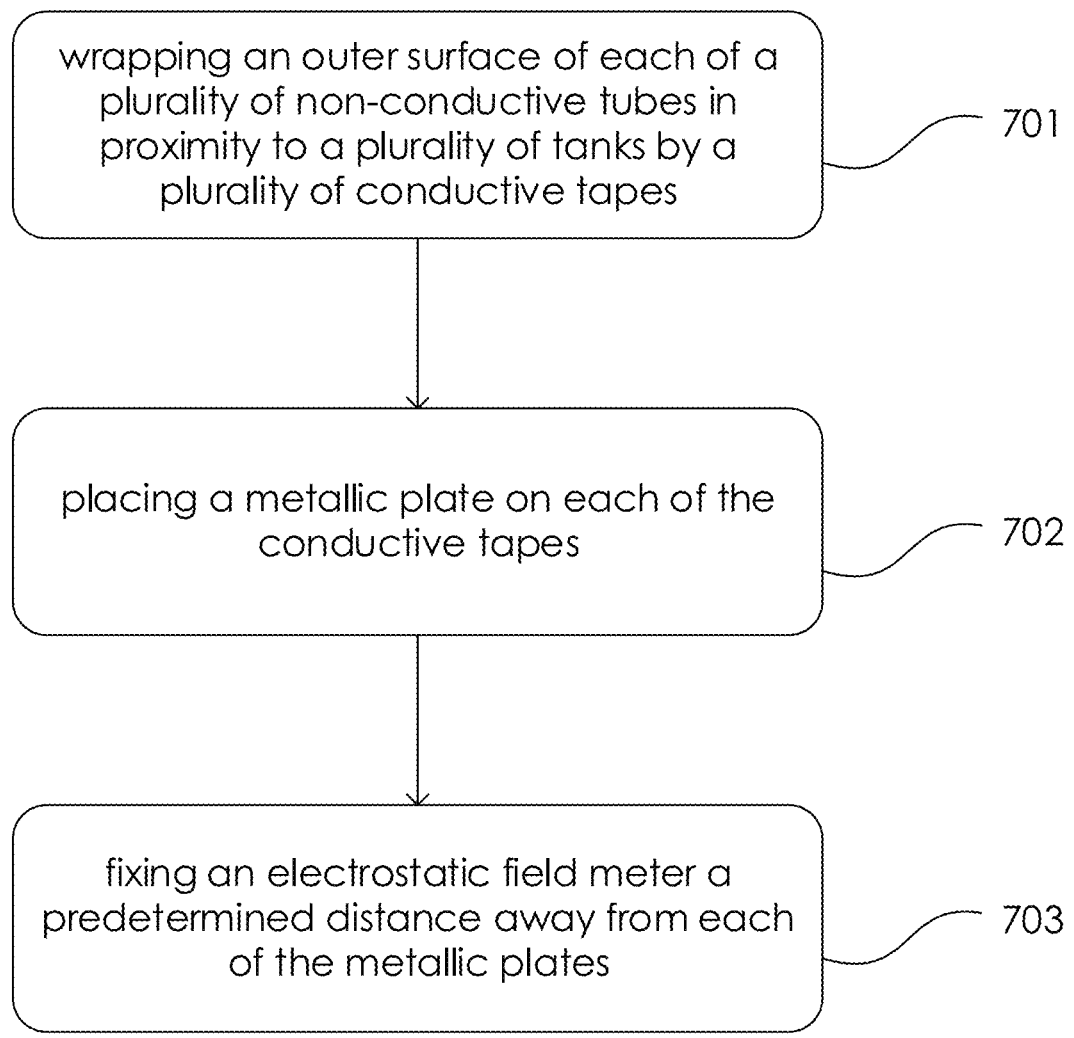
FIG. 7 illustrates a flow chart of monitoring static charge according to some embodiments of the present disclosure.

In the circumstances that the monitoring system in the present disclosure is used in a factory which includes a semiconductor manufacturing system, the operations of the method may refer to FIG. 7, which illustrates a flow chart of monitoring static charge according to some embodiments of the present disclosure. Such method may include an operation 701: wrapping an outer surface of each of a plurality of non-conductive tubes in proximity to a plurality of tanks by a plurality of conductive tapes; an operation 702: placing a metallic plate on each of the conductive tapes; and an operation 703: fixing an electrostatic field meter a predetermined distance away from each of the metallic plates.

In performing the operations 701, 702 and 703, the semiconductor manufacturing system disclosed in FIG. 5 may be utilized, and the repeated descriptions of the features and functions of the monitoring system are omitted here for brevity. By wrapping the non-conductive tubes by the conductive tapes and using the metallic plate and the electrostatic field meter in several positions, even though a great quantity of high-resistance fluids are transported therein quickly and continuously, the change of the static charge generated or accumulated in the semiconductor manufacturing system may be monitored easily, safely, and automatically.

According to the present disclosure, a monitoring system and a method of monitoring static charge are disclosed. In considering that a large portion of tubes in factories are made of plastic, and the transporting of the chemical materials in the plastic tubes may generate static charges due to friction, particularly, when the resistance of the chemical materials are high, the present disclosure uses a conductive tape wrapped around an outer surface of a non-conductive tube to accumulate the static charges, and uses a metallic plate connected to the conductive tape as an antenna for monitoring. The static charges induced from the conductive tape may be distributed at the surface of the metallic plate and be detected by an electrostatic field meter disposed a predetermined distance away from the metallic plate. The electrostatic field meter may provide a data to a computer for adjusting a flow rate of a fluid in the non-conductive tube. Accordingly, the amount of the static charges may be controlled by adjusting the flow rate in real time, and therefore the yield and productivity of the semiconductor products may be enhanced because the generation of arcing or the contamination particles formed thereby may be alleviated or avoided.

In one exemplary aspect, a monitoring system is provided. The monitoring system includes a non-conductive tube, a conductive tape, a metallic plate, and an electrostatic field meter. The non-conductive tube includes an outer surface. The conductive tape is wrapped around the outer surface of the non-conductive tube. The metallic plate contacts and extends away from the conductive tape. The electrostatic field meter is disposed a predetermined distance away from the metallic plate, and a static charge of the metallic plate is detectable by the electrostatic field meter.

In another exemplary aspect, a method of monitoring static charge is provided. The method includes the operations as follows. A plurality of static charges are collected from a conductive tape wrapped around an outer surface of a non-conductive tube. The plurality of static charges are induced to a metallic plate contacting and extending away from the conductive tape. The plurality of static charges are detected by an electrostatic field meter disposed a predetermined distance away from the metallic plate.

In yet another exemplary aspect, a method of monitoring static charge is provided. The method includes the operations as follows. A plurality of static charges are detected from a metallic plate connected to a conductive tape wrapped around an outer surface of a non-conductive tube by an electrostatic field meter. A flow rate of a fluid flowing through the non-conductive tube is adjusted to keep the plurality of static charges detected by the electrostatic field meter below a breakdown voltage of material of the non-conductive tube or a pump connected to the non-conductive tube.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of monitoring static charge, the method comprising:
    connecting a metallic plate to a conductive tape wrapped around an outer surface of a non-conductive tube;
    detecting a plurality of static charges from the metallic plate by an electrostatic field meter, wherein the conductive tape and the metallic plate are entirely disposed within a metallic box; and
    adjusting a flow rate of a fluid flowing through the non-conductive tube according to the plurality of static charges detected by the electrostatic field meter.

2. The method of claim 1, wherein the plurality of static charges detected by the electrostatic field meter is reduced to lower than a breakdown voltage of material of the non-conductive tube or a pump connected to the non-conductive tube by adjusting the flow rate of the fluid flowing through the non-conductive tube.

3. The method of claim 1, wherein the non-conductive tube comprises a plastic material with glass fiber.

4. The method of claim 1, wherein the electrostatic field meter is fixed at a place having a predetermined distance away from the metallic plate.

5. The method of claim 1, wherein the metallic box comprises an opening aligned with the electrostatic field meter and the metallic plate.

6. The method of claim 1, wherein the metallic box is grounded.

7. The method of claim 1, further comprising:
    setting a real-time alarm to adjust the flow rate of the fluid automatically when an electrostatic value exceeds a warning value.

8. The method of claim 1, wherein the fluid comprises butyl acetate or propylene glycol monomethyl ether acetate.

9. A method of semiconductor manufacturing, the method comprising:
    receiving a wafer with a material layer;
    applying a chemical fluid onto the material layer;
    preforming an operation to the wafer,
    wherein the chemical fluid is provided by a tube made by a non-metal material, and a metallic plate disposed on the tube is configured to accumulate a plurality of static charges, wherein the plurality of static charges accumulated at the metallic plate are detected by an electrostatic field meter disposed a predetermined distance away from the metallic plate; and
    adjusting a flow rate of the chemical fluid flowing through the tube to keep a plurality of static charges detected by the electrostatic field meter below a breakdown voltage of the non-metal material.

10. The method of claim 9, further comprising:
    wrapping a conductive tape around an outer surface of the tube; and
    connecting the metallic plate to the conductive tape.

11. The method of claim 9, wherein the chemical fluid comprises a volatile solvent.

12. The method of claim 9, wherein the metallic plate is entirely disposed within a metallic box.

13. The method of claim 12, wherein the metallic box comprises an opening aligned with the electrostatic field meter and the metallic plate.

14. A method of monitoring static charge, the method comprising:
    wrapping a conductive tape around an outer surface of a non-conductive tube;
    connecting a metallic plate to the conductive tape;
    applying a fluid in a semiconductor manufacturing process through the non-conductive tube made of a material having a resistance different from the fluid, wherein a plurality of static charges generated by a friction between the fluid and the non-conductive tube are accumulated by the metallic plate extending away from the non-conductive tube; and detecting the plurality of static charges accumulated at the metallic plate connected to the conductive tape by an electrostatic field meter disposed a predetermined distance away from the metallic plate.

15. The method of claim 14, wherein the metallic plate is entirely disposed within a metallic box, and the metallic box comprises an opening aligned with the electrostatic field meter and the metallic plate.

16. The method of claim 15, wherein the opening is at an intermediate point of a linear path between the metallic plate and the electrostatic field meter.

17. The method of claim 14, wherein the non-conductive tube is connected to a lorry tank arranged at a front end of the semiconductor manufacturing system.

18. The method of claim 14, where in the material comprises polytetrafluoroethene.

19. The method of claim 9, wherein the chemical fluid comprises butyl acetate or propylene glycol monomethyl ether acetate (PGMEA).

20. The method of claim 14, wherein the conductive tape comprises an electrically conductive adhesive and a support body.

\* \* \* \* \*